United States Patent
Camagna et al.

(10) Patent No.: US 11,683,022 B2
(45) Date of Patent: Jun. 20, 2023

(54) ELECTROMAGNETIC INTERFERENCE SUPPRESSION IN POWER CONVERTERS

(71) Applicant: Kinetic Technologies International Holdings LP, Toronto (CA)

(72) Inventors: John Camagna, El Dorado Hills, CA (US); Jan Nilsson, Sunnyvale, CA (US); Damoun Ahmadi, San Jose, CA (US)

(73) Assignee: Kinetic Technologies International Holdings LP, Toronto (CA)

( * ) Notice: Subject to any disclaimer, the term of this patent is extended or adjusted under 35 U.S.C. 154(b) by 0 days.

(21) Appl. No.: 17/684,671

(22) Filed: Mar. 2, 2022

(65) Prior Publication Data

US 2022/0286113 A1    Sep. 8, 2022

Related U.S. Application Data

(60) Provisional application No. 63/156,824, filed on Mar. 4, 2021.

(51) Int. Cl.
| | | |
|---|---|---|
| *H03H 11/04* | (2006.01) | |
| *H02M 1/44* | (2007.01) | |
| *H02M 7/06* | (2006.01) | |
| *H02M 1/12* | (2006.01) | |

(52) U.S. Cl.
CPC ........ *H03H 11/0422* (2013.01); *H02M 1/123* (2021.05); *H02M 1/44* (2013.01); *H02M 7/06* (2013.01)

(58) Field of Classification Search
CPC ............. H03H 11/0422; H03H 11/126; H03H 11/485; H02M 1/123; H02M 1/44; H02M 7/06
See application file for complete search history.

(56) References Cited

U.S. PATENT DOCUMENTS

| | | | | |
|---|---|---|---|---|
| 3,374,373 A | * | 3/1968 | Calvert ............... | H02P 29/0027 310/94 |
| 3,946,328 A | * | 3/1976 | Boctor ................. | H03H 11/126 330/109 |
| 4,232,363 A | * | 11/1980 | Higuchi .................... | G05F 1/62 363/90 |
| 4,298,924 A | * | 11/1981 | Genuit .................. | H02M 3/315 363/28 |
| 5,105,163 A | * | 4/1992 | Voorman ............. | H03H 11/126 330/306 |
| 5,699,016 A | * | 12/1997 | Federspiel ........... | H03H 11/126 330/306 |

(Continued)

*Primary Examiner* — Yusef A Ahmed
(74) *Attorney, Agent, or Firm* — Sheppard Mullin Richter & Hampton LLP

(57) ABSTRACT

In general, one aspect disclosed features an active choke circuit, including a first three-winding choke; a second three-winding choke; and an amplifier; wherein a first winding of the first three-winding choke is electrically coupled in series with a first winding of the second three-winding choke; wherein a second winding of the first three-winding choke is electrically coupled in series with a second winding of the second three-winding choke; wherein a third winding of the first three-winding choke is electrically coupled to an input of the amplifier; and wherein a third winding of the second three-winding choke is electrically coupled to an output of the amplifier.

8 Claims, 8 Drawing Sheets

(56) References Cited

U.S. PATENT DOCUMENTS

| | | | | |
|---|---|---|---|---|
| 6,081,157 | A * | 6/2000 | Ikeda | H03H 11/20 330/305 |
| 6,738,601 | B1 * | 5/2004 | Rofougaran | H03H 11/22 455/66.1 |
| 7,349,465 | B2 * | 3/2008 | Mangino | H04L 25/0272 375/220 |
| 10,211,865 | B1 * | 2/2019 | Miller | H03G 1/0088 |
| 10,411,660 | B1 * | 9/2019 | Ortiz | H03F 3/195 |
| 10,978,996 | B2 * | 4/2021 | Mukherjee | H03L 3/00 |
| 2002/0190580 | A1 * | 12/2002 | West | H02M 1/15 307/145 |
| 2003/0109239 | A1 * | 6/2003 | Sabouri | H04L 25/0278 455/307 |
| 2006/0062378 | A1 * | 3/2006 | Choksi | H04M 3/002 379/399.01 |
| 2007/0013456 | A1 * | 1/2007 | Lee | H03L 5/00 331/182 |
| 2007/0071112 | A1 * | 3/2007 | Gattani | H04L 25/0272 375/257 |
| 2008/0218258 | A1 * | 9/2008 | Crawley | H03F 3/45183 330/10 |
| 2008/0303589 | A1 * | 12/2008 | Kang | H03H 11/126 327/558 |
| 2010/0253477 | A1 * | 10/2010 | Seppa | G06K 7/0008 340/10.1 |
| 2018/0241354 | A1 * | 8/2018 | Gonano | H03F 3/45475 |
| 2019/0393912 | A1 * | 12/2019 | Ganci | H03F 3/45475 |
| 2020/0144974 | A1 * | 5/2020 | Westphal | H03F 1/302 |
| 2020/0365129 | A1 * | 11/2020 | Baker | G10H 3/22 |
| 2021/0313966 | A1 * | 10/2021 | Kumar | H03H 7/0115 |
| 2022/0311358 | A1 * | 9/2022 | Mah | H03F 3/213 |

* cited by examiner

ELECTROMAGNETIC INTERFERENCE SUPPRESSION IN POWER CONVERTERS

CROSS REFERENCE TO RELATED APPLICATIONS

The present application claims priority to U.S. Provisional Patent Application No. 63/156,824, filed Mar. 4, 2021, entitled "ELECTROMAGNETIC INTERFERENCE SUPPRESSION IN POWER CONVERTERS," the disclosure thereof incorporated by reference herein in its entirety.

TECHNICAL FIELD

This disclosure relates generally to electromagnetic interference (EMI) suppression, and more specifically to EMI suppression in power converters.

SUMMARY

In general, one aspect disclosed features an active choke circuit, comprising: a first three-winding choke; a second three-winding choke; and an amplifier; wherein a first winding of the first three-winding choke is electrically coupled in series with a first winding of the second three-winding choke; wherein a second winding of the first three-winding choke is electrically coupled in series with a second winding of the second three-winding choke; wherein a third winding of the first three-winding choke is electrically coupled to an input of the amplifier; and wherein a third winding of the second three-winding choke is electrically coupled to an output of the amplifier.

Embodiments of the active choke circuit may include one or more of the following features. Some embodiments comprise a first resistor and a first capacitor, wherein the first resistor and the first capacitor are coupled in series between the input of the amplifier and the third winding of the first three-winding choke; a second resistor and a second capacitor, wherein the second resistor and the second capacitor are coupled in parallel between the input of the amplifier and the output of the amplifier; wherein the first and second resistors have variable resistances; wherein the first and second capacitors have variable capacitances; a test circuit configured to inject a test signal at the input of the amplifier; a monitor circuit configured to monitor a signal at the third winding of the first three-winding choke; and a control circuit configured to vary the variable resistances and the variable capacitances based on the test signal and the signal at the third winding of the first three-winding choke.

In some embodiments, the monitor circuit comprises: a multiplier configured to correlate the test signal and the signal at the third winding of the first three-winding choke; and a low-pass filter comprising an input electrically coupled to an output of the multiplier; wherein the control circuit is configured to vary the variable resistances and the variable capacitances based on an output of the low-pass filter.

In some embodiments, the test signal is a pseudo-random signal or a sinusoidal signal; and the monitor circuit further comprises a gain phase detector configured to measure an amplitude and a phase of the output of the low-pass filter at a frequency of the test signal; wherein the control circuit is further configured to vary the variable resistances and the variable capacitances based on the amplitude and the phase of the output of the low-pass filter at the frequency of the test signal.

In some embodiments, the amplifier is a differential amplifier having differential inputs and differential outputs; the third winding of the first three-winding choke is electrically coupled between the differential inputs of the differential amplifier; and the third winding of the second three-winding choke is electrically coupled between the differential outputs of the differential amplifier. In some embodiments, the third winding of the first three-winding choke is terminated by first and second terminals; and the active choke circuit further comprises: a first resistor and a first capacitor, wherein the first resistor and the first capacitor are coupled in series between a first one of the differential inputs of the differential amplifier and the first terminal of the third winding of the first three-winding choke, and a second resistor and a second capacitor, wherein the second resistor and second capacitor are coupled in series between a second one of the differential inputs of the differential amplifier and the second terminal of the third winding of the first three-winding choke.

In some embodiments, the third winding of the second three-winding choke is terminated by first and second terminals; and the active choke circuit further comprises: a first resistor and a first capacitor, wherein the first resistor and the first capacitor are coupled in parallel between a first one of the differential inputs of the differential amplifier and a first one of the differential outputs of the differential amplifier, and a second resistor and a second capacitor, wherein the second resistor and second capacitor are coupled in parallel between a second one of the differential inputs of the differential amplifier and a second one of the differential outputs of the differential amplifier.

In some embodiments, the first and second resistors have variable resistances; the first and second capacitors have variable capacitances; and the active choke circuit further comprises a control circuit configured to vary the variable resistances and the variable capacitances based on outputs of the differential amplifier. Some embodiments comprise a comparator comprising: a first input electrically coupled to the first one of the differential outputs of the differential amplifier, a second input electrically coupled to the second one of the differential outputs of the differential amplifier, and an output electrically coupled to an input of the control circuit.

In some embodiments, the first winding of the second three-winding choke is terminated by first and second terminals; the second winding of the second three-winding choke is terminated by third and fourth terminals; and the active choke circuit further comprises: a first capacitor electrically coupled between a first one of the differential outputs of the differential amplifier and the first terminal of the first winding of the second three-winding choke, a second capacitor electrically coupled between the first one of the differential outputs of the differential amplifier and the first terminal of the second winding of the second three-winding choke, a third capacitor electrically coupled between a second one of the differential outputs of the differential amplifier and the second terminal of the first winding of the second three-winding choke, and a fourth capacitor electrically coupled between the second one of the differential outputs of the differential amplifier and the second terminal of the second winding of the second three-winding choke.

In general, one aspect disclosed features a switching power supply, comprising: a rectifier having input terminals and output terminals, wherein the input terminals of the rectifier are electrically coupled to AC supply input terminals; a DC-DC converter having input terminals; and an active choke circuit electrically coupled between the output terminals of the rectifier and the input terminals of the DC-DC converter, wherein the active choke circuit comprises: a first three-winding choke; a second three-winding choke; and an amplifier; wherein a first winding of the first three-winding choke is electrically coupled in series with a first winding of the second three-winding choke; wherein a second winding of the first three-winding choke is electrically coupled in series with a second winding of the second three-winding choke; wherein a third winding of the first three-winding choke is electrically coupled to an input of the amplifier; and wherein a third winding of the second three-winding choke is electrically coupled to an output of the amplifier.

Embodiments of the switching power supply may include one or more of the following features. In some embodiments, the active choke circuit further comprises: a first resistor and a first capacitor, wherein the first resistor and the first capacitor are coupled in series between the input of the amplifier and the third winding of the first three-winding choke; a second resistor and a second capacitor, wherein the second resistor and the second capacitor are coupled in parallel between the input of the amplifier and the output of the amplifier; wherein the first and second resistors have variable resistances; wherein the first and second capacitors have variable capacitances; a test circuit configured to inject a test signal at the input of the amplifier; a monitor circuit configured to monitor a signal at the third winding of the first three-winding choke; and a control circuit configured to vary the variable resistances and the variable capacitances based on the test signal and the signal at the third winding of the first three-winding choke.

In some embodiments, the monitor circuit comprises: a multiplier configured to correlate the test signal and the signal at the third winding of the first three-winding choke; and a low-pass filter comprising an input electrically coupled to an output of the multiplier; wherein the control circuit is configured to vary the variable resistances and the variable capacitances based on an output of the low-pass filter.

In some embodiments, the test signal is a pseudo-random signal or a sinusoidal signal; and the monitor circuit further comprises a gain phase detector configured to measure an amplitude and a phase of the output of the low-pass filter at a frequency of the test signal; wherein the control circuit is further configured to vary the variable resistances and the variable capacitances based on the amplitude and the phase of the output of the low-pass filter at the frequency of the test signal.

In some embodiments, the amplifier is a differential amplifier having differential inputs and differential outputs; the third winding of the first three-winding choke is electrically coupled between the differential inputs of the differential amplifier; and the third winding of the second three-winding choke is electrically coupled between the differential outputs of the differential amplifier.

In some embodiments, the third winding of the first three-winding choke is terminated by first and second terminals; and the active choke circuit further comprises: a first resistor and a first capacitor, wherein the first resistor and the first capacitor are coupled in series between a first one of the differential inputs of the differential amplifier and the first terminal of the third winding of the first three-winding choke, and a second resistor and a second capacitor, wherein the second resistor and second capacitor are coupled in series between a second one of the differential inputs of the differential amplifier and the second terminal of the third winding of the first three-winding choke.

In some embodiments, the third winding of the second three-winding choke is terminated by first and second terminals; and the active choke circuit further comprises: a first resistor and a first capacitor, wherein the first resistor and the first capacitor are coupled in parallel between a first one of the differential inputs of the differential amplifier and a first one of the differential outputs of the differential amplifier, and a second resistor and a second capacitor, wherein the second resistor and second capacitor are coupled in parallel between a second one of the differential inputs of the differential amplifier and a second one of the differential outputs of the differential amplifier.

In some embodiments, the first and second resistors have variable resistances; the first and second capacitors have variable capacitances; and the active choke circuit further comprises a control circuit configured to vary the variable resistances and the variable capacitances based on outputs of the differential amplifier. In some embodiments, the active choke circuit further comprises: a comparator comprising: a first input electrically coupled to the first one of the differential outputs of the differential amplifier, a second input electrically coupled to the second one of the differential outputs of the differential amplifier, and an output electrically coupled to an input of the control circuit.

In some embodiments, the first winding of the second three-winding choke is terminated by first and second terminals; the second winding of the second three-winding choke is terminated by third and fourth terminals; and the active choke circuit further comprises: a first capacitor electrically coupled between a first one of the differential outputs of the differential amplifier and the first terminal of the first winding of the second three-winding choke, a second capacitor electrically coupled between the first one of the differential outputs of the differential amplifier and the first terminal of the second winding of the second three-winding choke, a third capacitor electrically coupled between a second one of the differential outputs of the differential amplifier and the second terminal of the first winding of the second three-winding choke, and a fourth capacitor electrically coupled between the second one of the differential outputs of the differential amplifier and the second terminal of the second winding of the second three-winding choke.

DETAILED DESCRIPTION

Without suppression, switching power supplies may generate electromagnetic interference (EMI) at levels that exceed thresholds set by government regulatory agencies, for example such as the United States Federal Communications Commission (FCC). A common solution is to add a large choke. One such solution is illustrated in FIG. 1.

Figure 1:
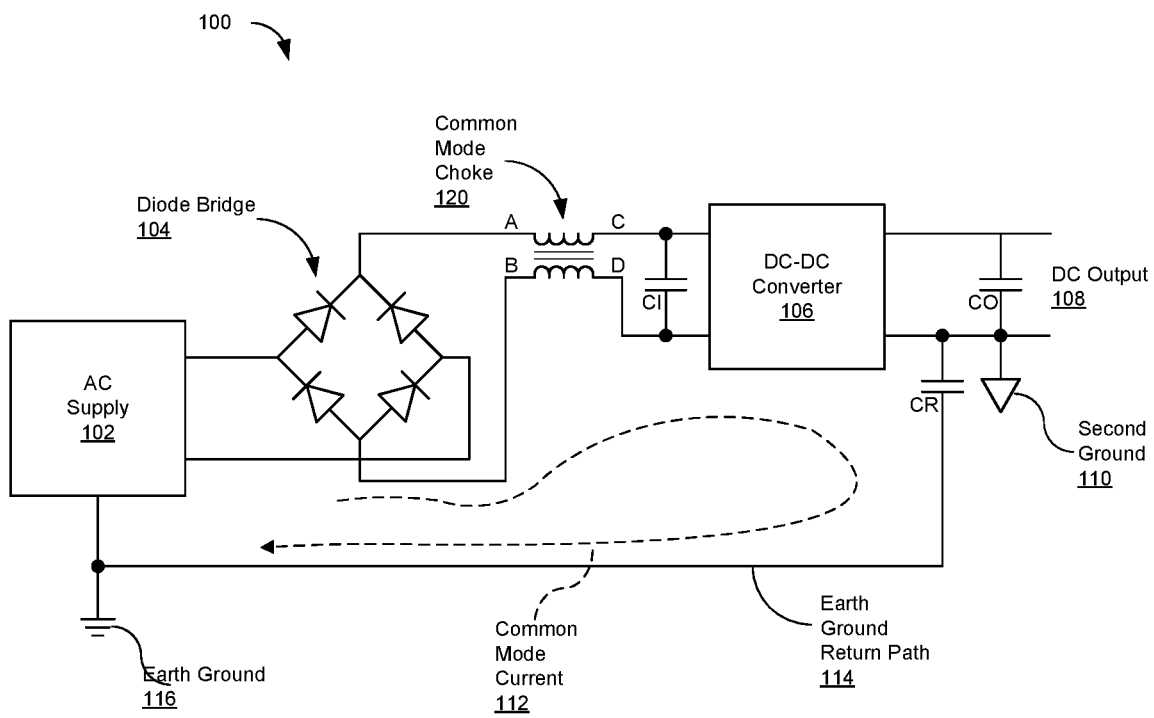
FIG. 1 illustrates a conventional solution for suppressing EMI in switching power supplies.

FIG. 1 illustrates a conventional switching power supply 100 that receives an alternating-current (AC) input and provides a direct-current (DC) output. For example, the switching power supply 100 may be a common wall charger for a portable electronic device. The charger receives the AC supply from a wall outlet, and provides the DC output to an output cable for charging the portable electronic device.

Referring to FIG. 1, an AC signal provided by an AC supply 102 is rectified by a diode bridge 104 before a DC-DC converter 106 reduces the DC level to the desired output level at a DC output 108 relative to a second ground 110. Without suppression, the circuit 100 generates a significant common-mode current 112 along an earth ground return path 114 to the earth ground 116 of the AC supply 102. The common mode current 112, shown as a broken line, is the primary source of the EMI generated by the circuit 100. In some embodiments, the diode bridge 104 may be implemented as another type of rectifier. The circuit 100 may include an input capacitor CI across the input of the DC-DC converter 106, and an output capacitor CO across the DC output of the DC-DC converter 106, and a capacitor CR in the earth ground return path 114.

To reduce EMI emissions, a common mode choke 120 is interposed between the diode bridge 104 and the DC-DC converter 106. The common mode choke 120 presents a low differential impedance, allowing the AC power to flow without disturbance, and presents a high common mode impedance that suppresses the common mode current, thereby suppressing the generated EMI. However, the common mode choke 120 causes a significant power supply efficiency loss due to its high resistance. Furthermore, the common mode choke 120 is large and heavy, thereby requiring the wall charger to be large and heavy as well.

Embodiments of the disclosed technology overcome these problems by employing a smaller choke, and an amplifier to amplify the intrinsic inductance of that choke. In implementations of the disclosed technology, the required choke inductance may be reduced by the gain of the amplifier. For example, in one embodiment, a 30 mH choke may be replaced with a 1 mH choke. Reducing the size of the choke has the benefits of reducing the physical size of the wall charger, while also increasing its efficiency.

Figure 2:
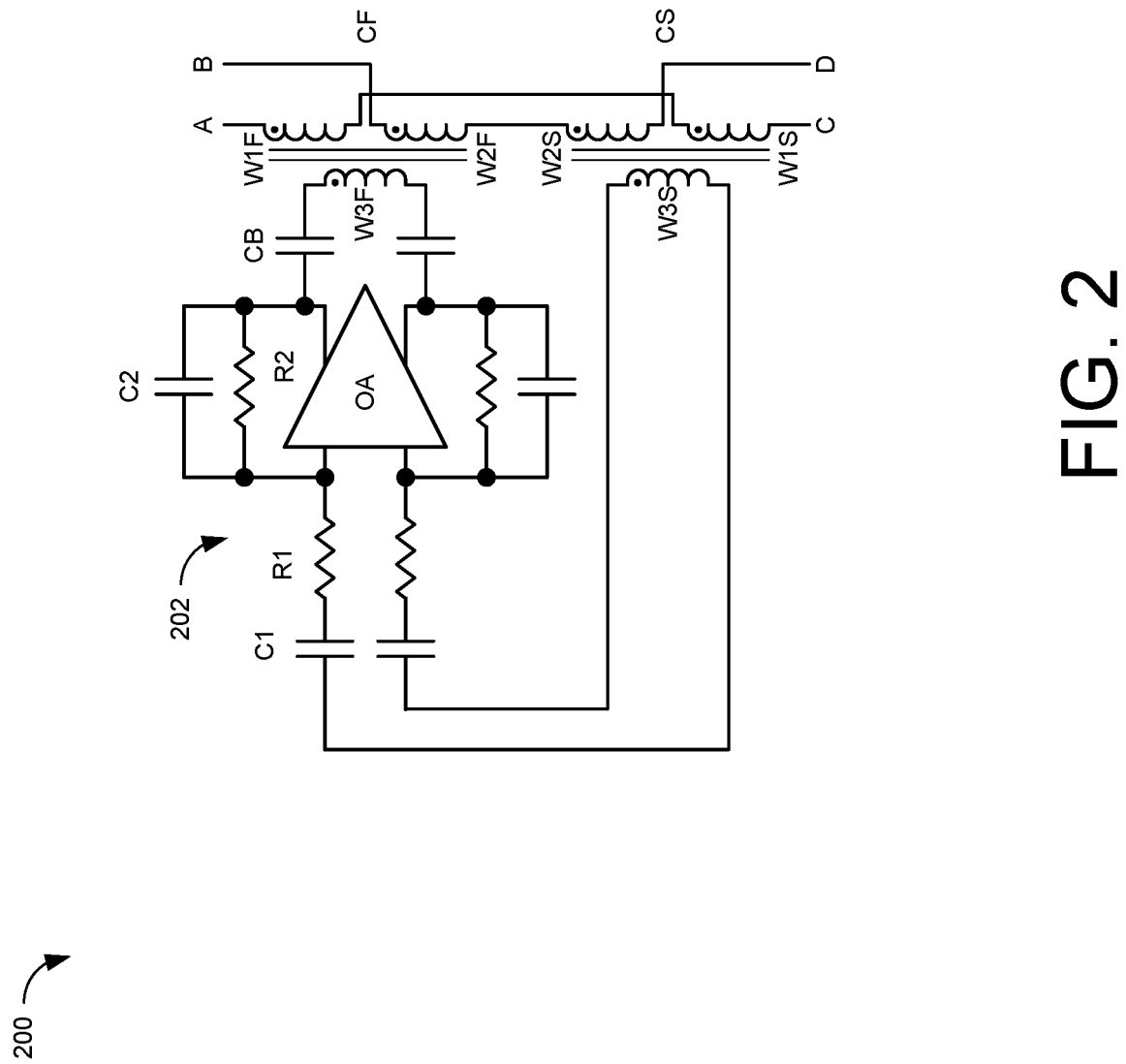
FIG. 2 illustrates an active choke circuit that can replace a common mode choke in a switching power supply according to some embodiments of the disclosed technology.

FIG. 2 illustrates an active choke circuit 200 that can replace a common mode choke in a switching power supply according to some embodiments of the disclosed technology. For example, the active choke circuit 200 of FIG. 2 may replace the common mode choke of FIG. 1. Referring to FIG. 2, the terminals A, B, C, D of the active choke circuit 200 refer to the terminals of the common mode choke in FIG. 1 having the same labels. The terminal pairs may be reversed, such that terminals A, B, C, D of the active choke circuit 200 correspond to terminals C, D, A, B, respectively, of the common mode choke in FIG. 1. And although described and depicted as a double-ended circuit, active choke circuit 200 may be implemented as a single-ended circuit.

Referring to FIG. 2, the active choke circuit 200 includes a sense choke CS, a force choke CF, and an amplifier 202 configured as a bandpass filter. Each of the chokes may be implemented as a toroidal choke with three windings. For each choke, the three windings may be evenly spaced from each other.

In the example of FIG. 2, the amplifier 202 includes a differential operational amplifier OA. On the first side of the operational amplifier OA, a filter capacitor C1 is electrically coupled in series with a filter resistor R1, a feedback capacitor C2 is electrically coupled in parallel with a feedback resistor R2, and a blocking capacitor CB is electrically coupled to the output of the operational amplifier OA. In the differential implementation of FIG. 2, the second side of the operational amplifier OA may be configured in a similar manner. In other embodiments, the amplifier 202 may be implemented as a single-ended circuit. In some embodiments, other amplifier circuits may be used in place of the amplifier 202.

A first winding W1F of the force choke CF may be electrically coupled in series with a first winding W1S of the sense choke CS between terminals A and C. A second winding W2F of the force choke CF may be electrically coupled in series with a second winding W2S of the sense choke CS between terminals B and D. A third winding of the force choke CF may be electrically coupled to the output of the amplifier 202. A third winding of the sense choke CS may be electrically coupled to the input of the amplifier 202. The standard dot convention is used to indicate the polarities of the choke windings in FIG. 2.

In operation, the sense choke CS detects the common mode current, and converts it to a voltage at the input of the operational amplifier 202. The operational amplifier 202 amplifies this input signal, and drives a force choke CF with the amplified signal through blocking capacitors CB. The blocking capacitors CB prevent DC voltage from being forced across the choke winding, and thereby prevent current saturation of the force choke CF.

To prevent excessive power consumption, the values of capacitors CB and C1 and resistor R1 may be selected to reduce the gain at 60 Hz, and may be selected to set the high-pass corner at 75 kHz. The values of resistor R2 and capacitor C2 may be selected to form the low-pass corner of the filter, and stabilize the overall loop by reducing the gain before the parasitic pole of the force choke CF is reached. As a nonlimiting example, the values may be C1=22 pf, R1=100 kohm, R2=5 Mohm and C2=100 fF, and the inductance of each choke CF, CS may be 1 mH.

The voltage across the force choke CF produces an equal and opposite current to cancel the current across the sense choke CS. This amplifies the overall common mode impedance of the force choke CF, thereby greatly reducing the common mode current, and therefore the generated EMI. In some embodiments, the force choke CF and the sense choke CS may be selected to be similar, such that the chokes CF, CS cancel their choke parasitics to the first order.

In some embodiments, the resistors R1 and R2, and the capacitors C1 and C2, may be replaced with a higher-order transfer function. These embodiments provide additional filtering, and may include multiple stages of operational amplifiers.

Figure 3B:
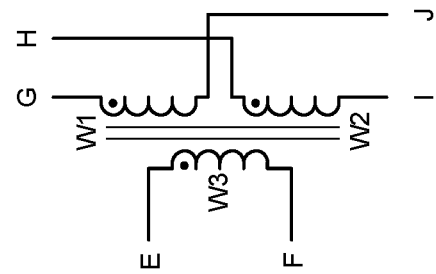
FIG. 3B illustrates terminals of a choke that the current source may replace.
Figure 3A:
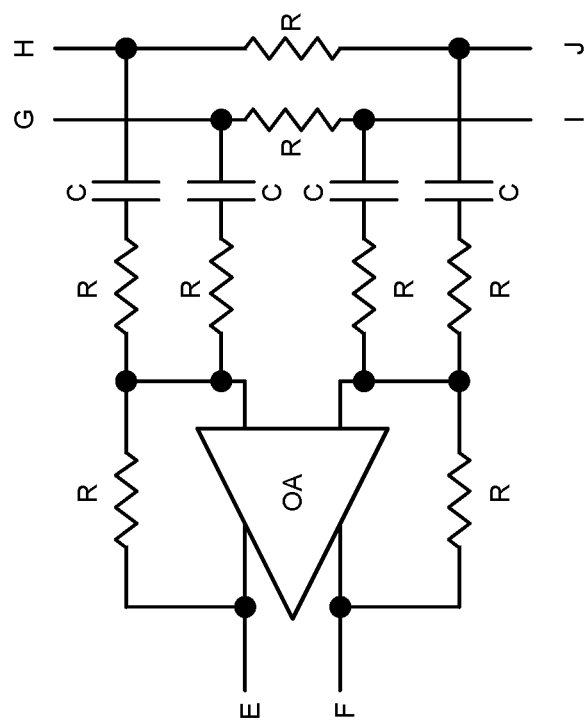
FIG. 3A illustrates an example resistive current source according to some embodiments of the disclosed technology.

In some embodiments, the sense choke CS of the active choke circuit 200 of FIG. 2 may be replaced with a current source. FIG. 3A illustrates an example resistive current source according to some embodiments of the disclosed technology. While a resistive current source is described and illustrated, other current sources may be used. Referring to FIG. 3B, the resistive current source may include an operational amplifier OA, capacitors C, and resistors R. In these embodiments, current is sensed by the resistors, and is then AC-coupled and buffered by the operational amplifier OA. FIG. 3B is provided for reference, and illustrates terminals E, F, G, H, I, J of a choke that correspond to the terminals in FIG. 3B. In FIG. 3B, the windings W1, W2, and W3 correspond to the windings of the chokes CS, CF of FIG. 2.

Figure 4B:
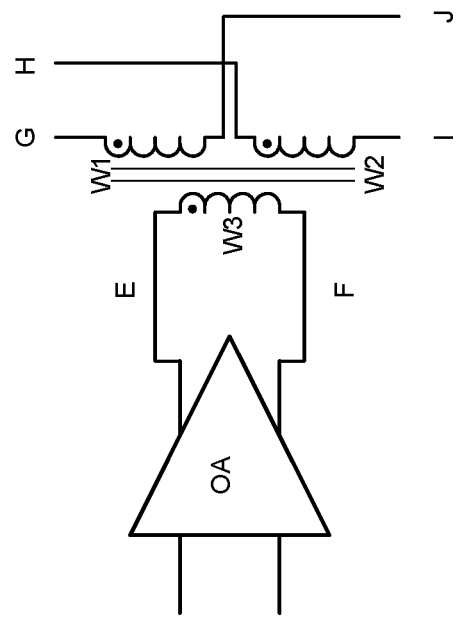
FIG. 4B illustrates terminals of a choke that the circuit may replace.
Figure 4A:
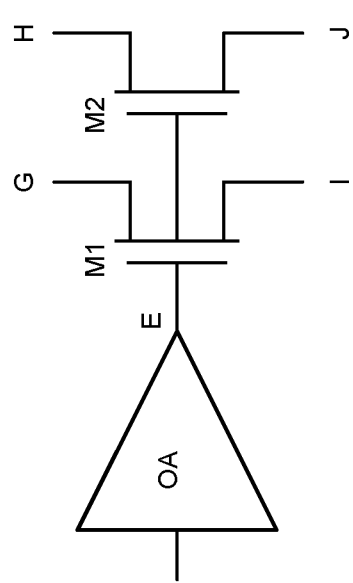
FIG. 4A illustrates an example active MOSFET circuit according to some embodiments of the disclosed technology.

In some embodiments, the force choke CF1 of the active choke circuit 200 of FIG. 2 may be replaced with an active metal-oxide semiconductor field-effect transistor (MOSFET) circuit. FIG. 4A illustrates an example active MOSFET circuit according to some embodiments of the disclosed technology. Referring to FIG. 4B, an operational amplifier OA drives a pair of MOSFETs M2, M2 connected in parallel. Although depicted as a single-ended circuit in FIG. 4A, the active MOSFET circuit may also be implemented as a double-ended circuit. FIG. 4B is provided for reference, and illustrates terminals G, H, I, J that correspond to the terminals in FIG. 4A. In FIG. 4B, the windings W1F, W2F, and W3F correspond to the windings of the force choke CF of FIG. 2.

Figure 5:
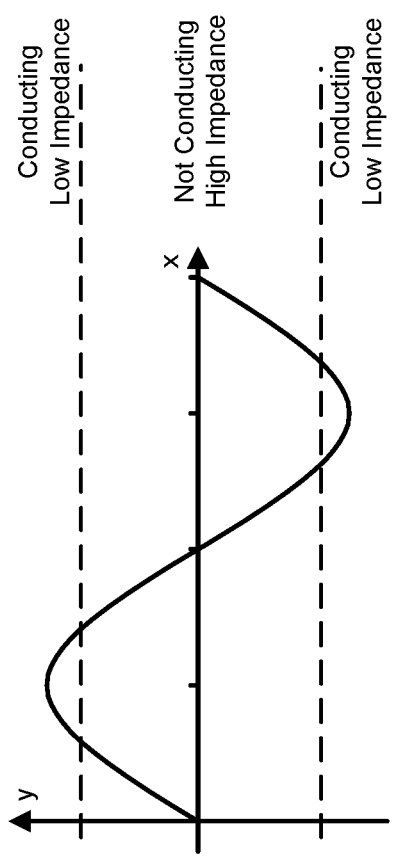
FIG. 5 graphically illustrates the behavior of a diode bridge.

The diode bridge of FIG. 1 has a variable impedance during the 50/60 Hz power supply cycle. At the voltage waveform peak, when the diodes are forward conducting, the impedance is low and allows more common mode current to flow into the charging cable at the DC output. When the diode bridge is not conducting, the impedance is much higher, and the common mode current is hence much lower. FIG. 5 graphically illustrates this behavior.

Some embodiments employ this phenomenon to place the amplifier 202 in a low-power mode for some or all of the time when the diode bridge is not conducting. The amplifier 202 may be placed in a low-power mode by turning the amplifier off, reducing the loop gain, reducing the bias current inside the amplifier 202, similar techniques, or any combination thereof.

The timing for disabling and enabling the amplifier 202 may be determined in any manner. In some embodiments, a comparator may be employed to monitor the input AC waveform. In these embodiments, the amplifier 202 may be placed in a high-power mode for a predetermined interval on detecting a zero crossing of the AC waveform before returning to a low-power mode. In some embodiments, the switching operations of the DC-DC converter may be monitored. In these embodiments, the amplifier 202 may be placed in a high-power mode for a predetermined interval on detecting a switching operation of the DC-DC converter before returning to a low-power mode. These techniques may result in a similar amount of EMI suppression, but with much lower power consumption. In some embodiments, the power consumption may be reduced by 50% or more.

The switching of a converter power FET in the DC-DC converter is the dominant common mode noise source of a switching power supply. Some embodiments monitor the switching of the converter power FET to determine when high-noise events occur, and to increase the loop gain and power correspondingly. These embodiments provide an overall reduction in power consumption.

The disclosed common mode suppression techniques employ feedback loops for detecting and compensating for the common mode current. These feedback loops are affected by the impedance of the AC supply to earth ground, as well as the parasitic return to earth ground of the powered device. But power supplies are typically sold worldwide, and the earth ground impedance varies significantly by location. The return path of the powered device can also vary significantly depending upon the device being powered and its particular path to earth ground. Some embodiments employ one or more techniques to maintain the stability of the feedback loop despite these uncertainties.

Figure 6:
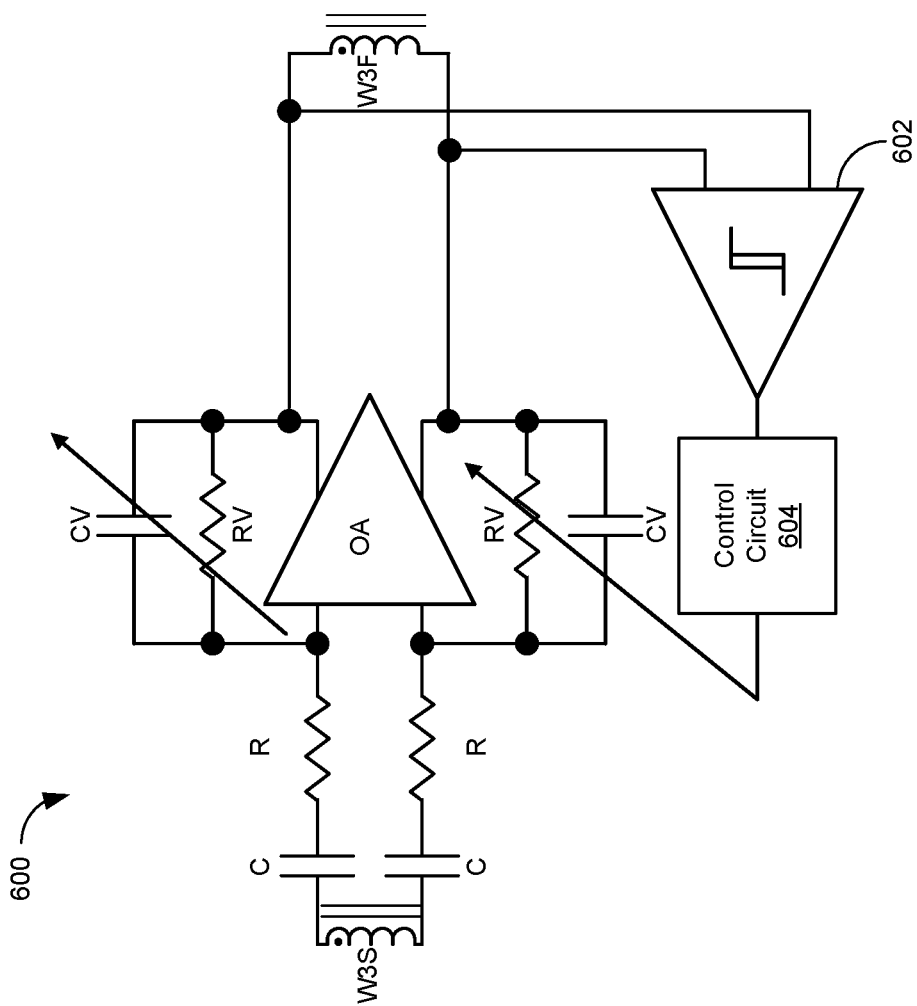
FIG. 6 illustrates an example circuit for monitoring and controlling the output of an amplifier driving the force choke according to some embodiments of the disclosed technology.

To maintain feedback loop stability, some embodiments monitor the output of the amplifier 202 to ensure it never exceeds a normal operating voltage. FIG. 6 illustrates an example circuit 600 for monitoring and controlling the output of an amplifier driving the force choke according to some embodiments of the disclosed technology. While the circuit 600 is depicted and described as being double-ended, in some implementations the circuit may be single-ended. Referring to FIGS. 6 and 2, the circuit 600 may be coupled between winding W3S of the sense choke CS and winding W3F of force choke CF. A comparator 602 may monitor the output of the amplifier that is provided to the force choke CF, and may drive a control circuit 604. In some embodiments, the control circuit 604 may be implemented as a finite state machine, timer, or a similar circuit. The control circuit 604 may control the values of variable feedback capacitors CV and resistors RV of the amplifier, without changing the value of their time constant, to keep the output voltage of the amplifier within a normal operating range. The comparator 602 may monitor the output voltage of the amplifier OA at power up and periodically thereafter while the gain is slowly increased. When the output voltage of the amplifier OA exceeds the normal operating voltage, the comparator 602 may enable the control circuit 604, which reduces the gain of the amplifier to a safe operating level. As the circuit is unstable at the point where the phase is inverted and the gain is higher than unity, reducing the gain sufficiently will inherently make the circuit stable.

Figure 7:
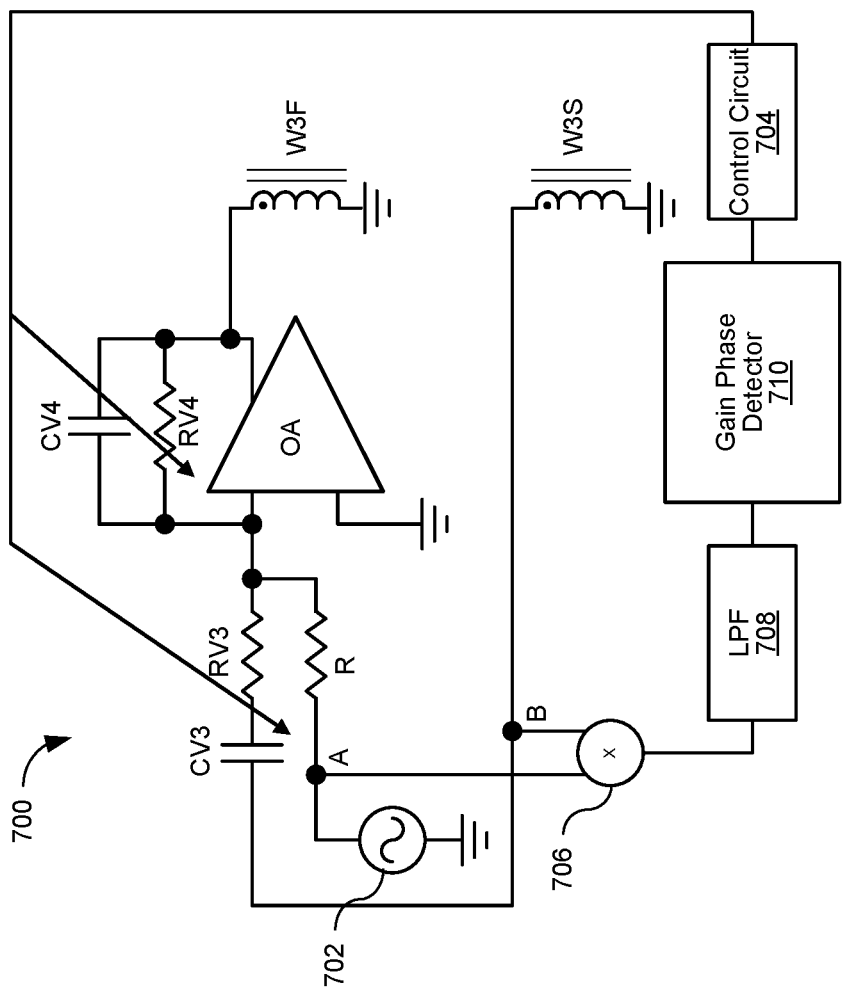
FIG. 7 illustrates a circuit that injects and monitors a test signal to control the output of an amplifier driving a winding of a force choke according to some embodiments of the disclosed technology.

Some embodiments employ a test signal to maintain feedback loop stability. FIG. 7 illustrates a circuit 700 that injects and monitors a test signal to control the output of an amplifier driving winding W3F of the force choke CF according to some embodiments of the disclosed technology. While the circuit 700 is depicted and described as being single-ended, in some implementations the circuit 700 may be double-ended. Referring to FIG. 7, a test signal may be injected at point A, at the power supply 702, and monitored at point B. The injected and monitored test signals may be correlated by a multiplier 706, and filtered by a low-pass filter (LPF) 708 to directly measure the loop response.

In some embodiments, the test signal may be a pseudo-random signal. In other embodiments, the test signal may be sinusoidal. In these embodiments, the amplitude and phase of the signal provided by the low-pass filter 708 indicate the amplitude and phase of the feedback loop at the frequency of the test signal. The amplitude and phase may be measured by a gain phase detector 710. Once the loop characteristics are known, a control circuit 704 may adjust the gain and filter poles of the loop, for example adjusting the gain and filter capacitance and resistance by adjusting variable resistors RV3, RV4 and variable capacitors CV3, CV4, to ensure stability of the loop. In some embodiments, the control circuit 704 may be implemented as a finite state machine, timer, or a similar circuit.

Each choke has an effective shunt capacitance due to the winding of the coils. At high frequencies this shunt capacitance creates a capacitive path that bypasses the inductance of the choke. Some embodiments compensate for this bypass phenomenon by adding a feedforward path from the output of the amplifier directly to the coil of the choke to reduce the effective parasitic capacitance.

Figure 8:
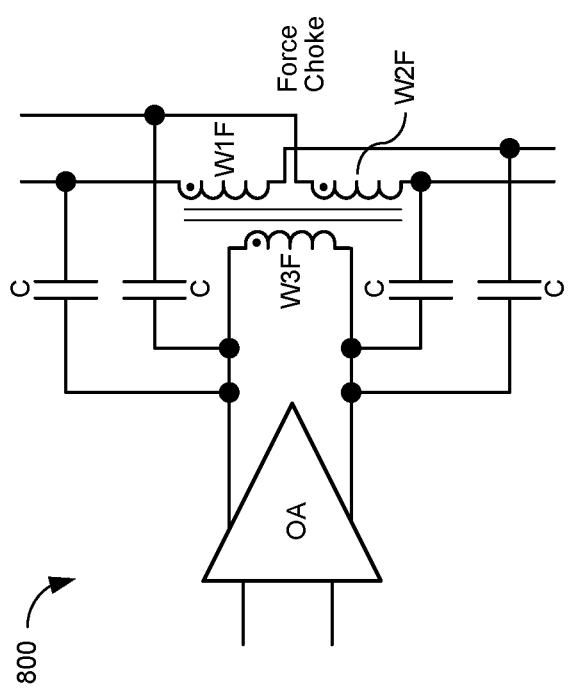
FIG. 8 illustrates a circuit that includes a feedforward path from the output of the amplifier directly to the windings of a force choke according to some embodiments of the disclosed technology.

FIG. 8 illustrates a circuit 800 that includes a feedforward path from the output of the amplifier directly to the windings of the force choke CF according to some embodiments of the disclosed technology. Referring to FIG. 8, the feedforward path may be implemented using capacitors C connecting ends of the windings W1F, W2F.

Spatially relative terms such as "under," "below," "lower," "over," "upper," and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising," and the like are open ended terms that indicate the presence of stated elements or features, but do not preclude additional elements or features. The articles "a," "an" and "the" are intended to include the plural as well as the singular, unless the context clearly indicates otherwise.

Although this invention has been disclosed in the context of certain implementations and examples, it will be understood by those skilled in the art that the present invention extends beyond the specifically disclosed implementations to other alternative implementations and/or uses of the invention and obvious modifications and equivalents thereof. Thus, it is intended that the scope of the present invention herein disclosed should not be limited by the particular disclosed implementations described above.

Furthermore, the skilled artisan will recognize the interchangeability of various features from different implementations. In addition to the variations described herein, other known equivalents for each feature can be mixed and matched by one of ordinary skill in this art to construct analogous systems and techniques in accordance with principles of the present invention.

It is to be understood that not necessarily all objects or advantages may be achieved in accordance with any particular implementation of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

What is claimed is:

1. An active choke circuit, comprising:
a first three-winding choke;
a second three-winding choke;
an amplifier;
wherein a first winding of the first three-winding choke is electrically coupled in series with a first winding of the second three-winding choke;
wherein a second winding of the first three-winding choke is electrically coupled in series with a second winding of the second three-winding choke;
wherein a third winding of the first three-winding choke is electrically coupled to an input of the amplifier;
wherein a third winding of the second three-winding choke is electrically coupled to an output of the amplifier;
a first resistor and a first capacitor, wherein the first resistor and the first capacitor are coupled in series between the input of the amplifier and the third winding of the first three-winding choke;
a second resistor and a second capacitor, wherein the second resistor and the second capacitor are coupled in parallel between the input of the amplifier and the output of the amplifier;
wherein the first and second resistors have variable resistances;
wherein the first and second capacitors have variable capacitances;
a test circuit configured to inject a test signal at the input of the amplifier;
a monitor circuit configured to monitor a signal at the third winding of the first three-winding choke; and
a control circuit configured to vary the variable resistances and the variable capacitances based on the test signal and the signal at the third winding of the first three-winding choke;
wherein the monitor circuit comprises:
a multiplier configured to correlate the test signal and the signal at the third winding of the first three-winding choke, and
a low-pass filter comprising an input electrically coupled to an output of the multiplier,
wherein the control circuit is configured to vary the variable resistances and the variable capacitances based on an output of the low-pass filter.

2. The active choke circuit of claim 1, wherein:
the test signal is a pseudo-random signal or a sinusoidal signal; and
the monitor circuit further comprises a gain phase detector configured to measure an amplitude and a phase of the output of the low-pass filter at a frequency of the test signal;
wherein the control circuit is further configured to vary the variable resistances and the variable capacitances based on the amplitude and the phase of the output of the low-pass filter at the frequency of the test signal.

3. The active choke circuit of claim 1, wherein:
the amplifier is a differential amplifier having differential inputs and differential outputs;
the third winding of the first three-winding choke is electrically coupled between the differential inputs of the differential amplifier; and
the third winding of the second three-winding choke is electrically coupled between the differential outputs of the differential amplifier.

4. A switching power supply, comprising:
a rectifier having input terminals and output terminals, wherein the input terminals of the rectifier are electrically coupled to AC supply input terminals;
a DC-DC converter having input terminals; and
an active choke circuit electrically coupled between the output terminals of the rectifier and the input terminals of the DC-DC converter, wherein the active choke circuit comprises:
a first three-winding choke;
a second three-winding choke; and
an amplifier;
wherein a first winding of the first three-winding choke is electrically coupled in series with a first winding of the second three-winding choke;
wherein a second winding of the first three-winding choke is electrically coupled in series with a second winding of the second three-winding choke;

wherein a third winding of the first three-winding choke is electrically coupled to an input of the amplifier;

wherein a third winding of the second three-winding choke is electrically coupled to an output of the amplifier;

wherein the active choke circuit further comprises:
a first resistor and a first capacitor, wherein the first resistor and the first capacitor are coupled in series between the input of the amplifier and the third winding of the first three-winding choke,
a second resistor and a second capacitor, wherein the second resistor and the second capacitor are coupled in parallel between the input of the amplifier and the output of the amplifier,
wherein the first and second resistors have variable resistances,
wherein the first and second capacitors have variable capacitances,
a test circuit configured to inject a test signal at the input of the amplifier,
a monitor circuit configured to monitor a signal at the third winding of the first three-winding choke, and
a control circuit configured to vary the variable resistances and the variable capacitances based on the test signal and the signal at the third winding of the first three-winding choke; and wherein the monitor circuit comprises:
a multiplier configured to correlate the test signal and the signal at the third winding of the first three-winding choke, and
a low-pass filter comprising an input electrically coupled to an output of the multiplier,
wherein the control circuit is configured to vary the variable resistances and the variable capacitances based on an output of the low-pass filter.

5. The switching power supply of claim 4, wherein:
the test signal is a pseudo-random signal or a sinusoidal signal; and
the monitor circuit further comprises a gain phase detector configured to measure an amplitude and a phase of the output of the low-pass filter at a frequency of the test signal;
wherein the control circuit is further configured to vary the variable resistances and the variable capacitances based on the amplitude and the phase of the output of the low-pass filter at the frequency of the test signal.

6. The switching power supply of claim 4, wherein:
the amplifier is a differential amplifier having differential inputs and differential outputs;
the third winding of the first three-winding choke is electrically coupled between the differential inputs of the differential amplifier; and
the third winding of the second three-winding choke is electrically coupled between the differential outputs of the differential amplifier.

7. An active choke circuit, comprising:
a first three-winding choke;
a second three-winding choke;
an amplifier;
wherein a first winding of the first three-winding choke is electrically coupled in series with a first winding of the second three-winding choke;
wherein a second winding of the first three-winding choke is electrically coupled in series with a second winding of the second three-winding choke;
wherein a third winding of the first three-winding choke is electrically coupled to an input of the amplifier;

wherein a third winding of the second three-winding choke is electrically coupled to an output of the amplifier;

wherein:
the amplifier is a differential amplifier having differential inputs and differential outputs,
the third winding of the first three-winding choke is electrically coupled between the differential inputs of the differential amplifier,
the third winding of the second three-winding choke is electrically coupled between the differential outputs of the differential amplifier,
the third winding of the second three-winding choke is terminated by first and second terminals,
the active choke circuit further comprises:
a first resistor and a first capacitor, wherein the first resistor and the first capacitor are coupled in parallel between a first one of the differential inputs of the differential amplifier and a first one of the differential outputs of the differential amplifier, and
a second resistor and a second capacitor, wherein the second resistor and second capacitor are coupled in parallel between a second one of the differential inputs of the differential amplifier and a second one of the differential outputs of the differential amplifier,
the first and second resistors have variable resistances,
the first and second capacitors have variable capacitances, and
the active choke circuit further comprises a control circuit configured to vary the variable resistances and the variable capacitances based on the differential outputs of the differential amplifier; and a comparator comprising:
a first input electrically coupled to the first one of the differential outputs of the differential amplifier,
a second input electrically coupled to the second one of the differential outputs of the differential amplifier, and
an output electrically coupled to an input of the control circuit.

8. A switching power supply, comprising:
a rectifier having input terminals and output terminals, wherein the input terminals of the rectifier are electrically coupled to AC supply input terminals;
a DC-DC converter having input terminals; and
an active choke circuit electrically coupled between the output terminals of the rectifier and the input terminals of the DC-DC converter, wherein the active choke circuit comprises:
a first three-winding choke;
a second three-winding choke; and
an amplifier;
wherein a first winding of the first three-winding choke is electrically coupled in series with a first winding of the second three-winding choke;
wherein a second winding of the first three-winding choke is electrically coupled in series with a second winding of the second three-winding choke;
wherein a third winding of the first three-winding choke is electrically coupled to an input of the amplifier;
wherein a third winding of the second three-winding choke is electrically coupled to an output of the amplifier;

wherein:
the amplifier is a differential amplifier having differential inputs and differential outputs,
the third winding of the first three-winding choke is electrically coupled between the differential inputs of the differential amplifier,
the third winding of the second three-winding choke is electrically coupled between the differential outputs of the differential amplifier,
the third winding of the second three-winding choke is terminated by first and second terminals, the active choke circuit further comprises:
a first resistor and a first capacitor, wherein the first resistor and the first capacitor are coupled in parallel between a first one of the differential inputs of the differential amplifier and a first one of the differential outputs of the differential amplifier, and
a second resistor and a second capacitor, wherein the second resistor and second capacitor are coupled in parallel between a second one of the differential inputs of the differential amplifier and a second one of the differential outputs of the differential amplifier,
the first and second resistors have variable resistances,
the first and second capacitors have variable capacitances, and
the active choke circuit further comprises:
a control circuit configured to vary the variable resistances and the variable capacitances based on the differential outputs of the differential amplifier, and
a comparator comprising:
a first input electrically coupled to the first one of the differential outputs of the differential amplifier,
a second input electrically coupled to the second one of the differential outputs of the differential amplifier, and
an output electrically coupled to an input of the control circuit.

* * * * *